(12) United States Patent
Assefa et al.

(10) Patent No.: US 8,455,292 B2
(45) Date of Patent: Jun. 4, 2013

(54) DEPOSITION OF GERMANIUM FILM

(75) Inventors: Solomon Assefa, Ossining, NY (US);
Pratik P. Joshi, Cliffside Park, NJ (US);
Deborah A. Neumayer, Danbury, CT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/229,440

(22) Filed: Sep. 9, 2011

(65) Prior Publication Data
US 2013/0065349 A1 Mar. 14, 2013

(51) Int. Cl.
*H01L 21/00* (2006.01)

(52) U.S. Cl.
USPC ........... 438/69; 438/48; 438/57; 438/63; 438/71; 257/E31.001

(58) Field of Classification Search
None
See application file for complete search history.

(56) References Cited

U.S. PATENT DOCUMENTS

| | | | |
|---|---|---|---|
| 4,357,179 A | 11/1982 | Adams et al. | |
| 4,609,424 A | 9/1986 | Shuskus et al. | |
| 4,737,379 A | 4/1988 | Hudgens et al. | |
| 6,537,370 B1 | 3/2003 | Hernandez et al. | |
| 7,247,545 B2 | 7/2007 | Maa et al. | |
| 7,257,301 B2 * | 8/2007 | Homa et al. | 385/123 |
| 7,329,593 B2 | 2/2008 | Bauer et al. | |
| 7,476,627 B2 * | 1/2009 | Pomarede et al. | 438/767 |
| 7,790,495 B2 | 9/2010 | Assefa et al. | |
| 7,902,620 B2 * | 3/2011 | Assefa et al. | 257/432 |
| 2008/0110491 A1 | 5/2008 | Buller et al. | |
| 2010/0255662 A1 | 10/2010 | Witvrouw | |
| 2011/0024868 A1 * | 2/2011 | Drouin et al. | 257/463 |
| 2011/0227184 A1 * | 9/2011 | Mao et al. | 257/443 |
| 2011/0315992 A1 * | 12/2011 | Nguyen et al. | 257/66 |

OTHER PUBLICATIONS

Arrais et al., Characterization of hydrogenated amorphous germanium compounds obtained by x-ray chemical vapor deposition of germane: Effect of the irradiation dose on optical parameters and structural order, Journal of Applied Physics, vol. 102, 2007, pp. 104905.
Beyer et al., Hydrogen Stability in Hydrogenated Amorphous Germanium, Mat. Res. Soc. Symp. Proc., vol. 192, 1990, pp. 689-694.
Bouziem et al., Comparative studies of the influence of hydrogen incorporation on the electronic properties of a-Ge:H films prepared by two different techniques, Canadian Journal of Physics, vol. 77(9), Sep. 1999, pp. 659-666.
Chou et al., Evidence for the void size related IR absorption frequency shifts in hydrogenated amorphous germanium films, Solid State Communications, vol. 113, 2000, pp. 73-75.
Lucovsky et al., Chemical bonding of hydrogen and oxygen in glow-discharge-deposited thin films of a-Ge:H and a-Ge:(H,O), Phys. Review, vol. 31, 1985, pp. 2190-2197.

* cited by examiner

*Primary Examiner* — Leonard Chang
*Assistant Examiner* — Evren Seven
(74) *Attorney, Agent, or Firm* — Cantor Colburn LLP; Vazken Alexanian

(57) ABSTRACT

A method for forming a photodetector device includes forming waveguide feature on a substrate, and forming a photodetector feature including a germanium (Ge) film, the Ge film deposited on the waveguide feature using a plasma enhanced chemical vapor deposition (PECVD) process, the PECVD process having a deposition temperature from about 500° C. to about 550° C., and a deposition pressure from about 666.612 Pa to about 1066.579 Pa.

9 Claims, 7 Drawing Sheets

| TEMP | PRESSURE | GeH4 | He | POWER | TIME | Rs |
|---|---|---|---|---|---|---|
| 400 | 4 | 500 | 2000 | 50 | 60 | - |
| 400 | 8 | 500 | 2000 | 50 | 60 | - |
| 550 | 4 | 500 | 2000 | 50 | 60 | 4516K |
| 550 | 8 | 500 | 2000 | 50 | 60 | 3083K |

| POWER (W) | DEP RATE (A/sec) | Rs (Ω/□) |
|---|---|---|
| 100 | 96.7 | 586.90 |
| 200 | 106.7 | 2978.00 |
| 500 | 110.0 | 3530.20 |
| 1000 | 113.3 | 4439.90 |

FIG. 4

| TEMP | PRESSURE | GeH4 | He | POWER | TIME | Rs |
|---|---|---|---|---|---|---|
| 400 | 4 | 500 | 2000 | 50 | 60 | - |
| 400 | 8 | 500 | 2000 | 50 | 60 | - |
| 550 | 4 | 500 | 2000 | 50 | 60 | 4516K |
| 550 | 8 | 500 | 2000 | 50 | 60 | 3083K |

FIG. 6

DEPOSITION OF GERMANIUM FILM

FIELD

The present invention relates to germanium film, and more specifically, to methods for fabricating a germanium (Ge) material layer that may be used for fabricating devices.

DESCRIPTION OF RELATED ART

Previous fabrication methods for forming devices with germanium (Ge) film such as photodetector devices included forming a photodetector feature with a Ge film deposited over a silicon (Si) waveguide feature. The Ge film deposition processes included plasma vapor deposition (PVD), chemical vapor deposition (CVD), and epitaxial growth processes.

BRIEF SUMMARY

According to one embodiment of the present invention, a method for forming a photodetector device includes forming waveguide feature on a substrate, and forming a photodetector feature including a germanium (Ge) film, the Ge film deposited on the waveguide feature using a plasma enhanced chemical vapor deposition (PECVD) process, the PECVD process having a deposition temperature from about 500° C. to about 550° C., and a deposition pressure from about 666.612 Pa to about 1066.579 Pa.

According to another embodiment of the present invention, a method for forming a germanium film includes depositing a germanium film on a substrate using a plasma enhanced chemical vapor deposition process, the PECVD process having a deposition temperature between 500° C. and 550° C., and a deposition pressure between 666.612 Pa and 1066.579 Pa.

According to yet another embodiment of the present invention, a method for forming a germanium film, includes depositing a germanium film on a substrate using a plasma enhanced chemical vapor deposition (PECVD) process, the PECVD process having a deposition temperature between 500° C. and 550° C., and a deposition power between 50 W to 200 W.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

FIG. 4 illustrates a table illustrating the resultant surface resistance (Rs) of a Ge film.

FIG. 6 illustrates a table illustrating the resultant Rs of two exemplary Ge films.

DETAILED DESCRIPTION

The fabrication of devices such as photodetectors includes fabricating a photodetector portion. A photodetector portion that is formed from a Ge film presents challenges in forming a Ge film having a desired low roughness, low hydrogen content, low defects, and a relatively fast deposition rate. Variety of deposition methods may be employed for Ge film deposition, but they present a variety of drawbacks as well. For example, PVD methods often result in argon (Ar) inclusion in the Ge film structure during deposition and effusion during annealing processes that results in undesirable voids in the Ge film. Using a CVD process often results in an undesirably high surface roughness in the Ge film, while epitaxially grown Ge films often have a slow growth rate that undesirably increases the fabrication time for the photodetector.

The exemplary methods described below include an exemplary method for forming a Ge film that may be used in fabricating devices such as, for example, photodetectors, solar cells, or other types of semiconductor devices e.g. solar cells. An exemplary method of a plasma enhanced chemical vapor deposition (PECVD) process for forming a Ge film on a substrate or other surface is described below. Generally, a PECVD process is performed in a reactive chamber that forms a plasma material with excitation electrodes. A number of parameters may be adjusted to form the desired film, for example, the deposition temperature in the chamber, the chemistry of the deposition or plasma materials, the deposition pressure in the chamber, and the deposition power that includes the power used by the excitation electrodes. The methods described below result in a Ge film having a low surface roughness, a low hydrogen (H) content, low defects, and a relatively fast deposition rate.

Figure 1:
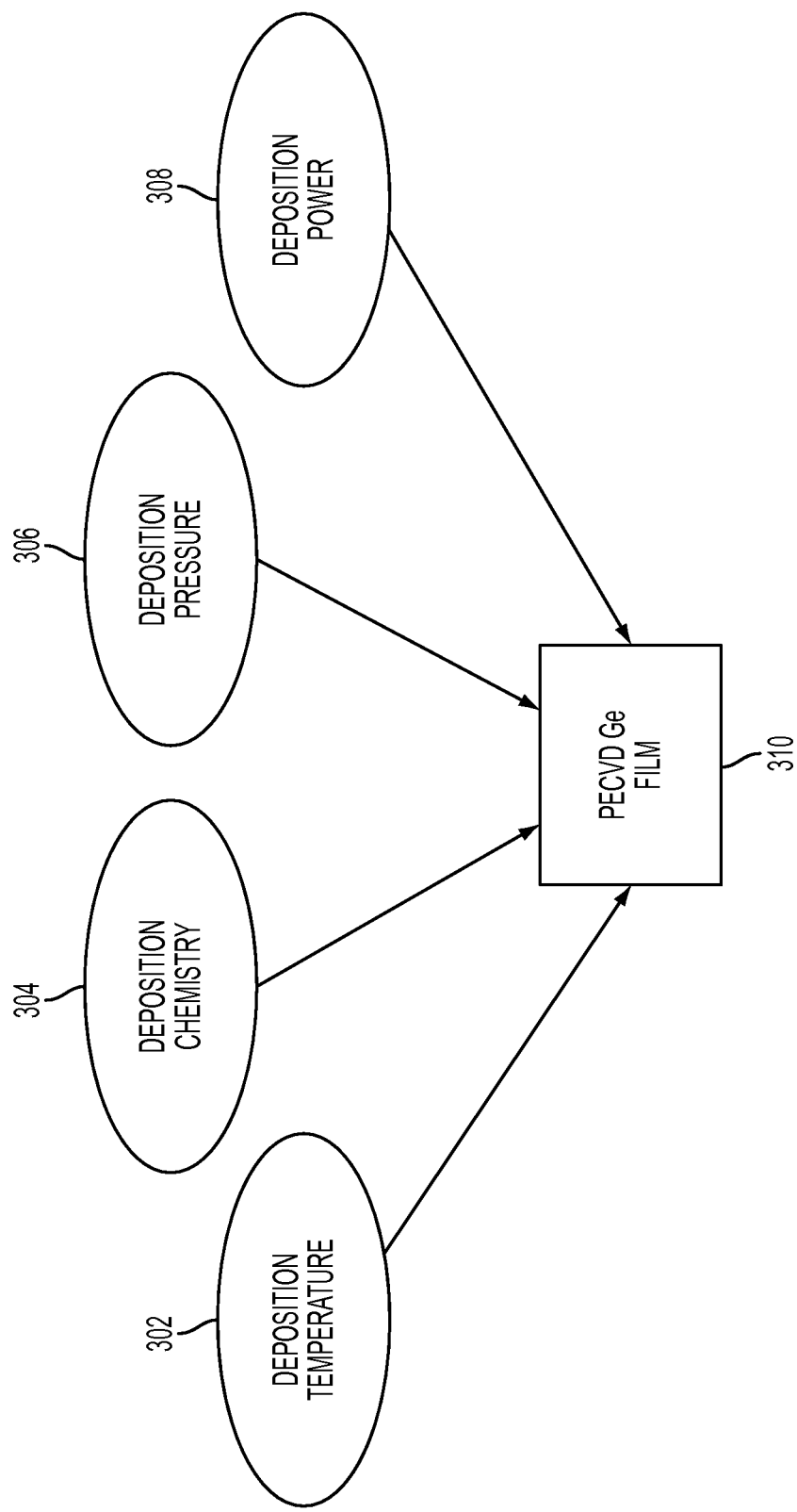
FIG. 1 illustrates a block diagram of parameters of an exemplary PECVD process method.

FIG. 1 illustrates a block diagram of parameters of an exemplary PECVD process method. The parameters include deposition temperature 302, deposition chemistry 304, deposition pressure 306, and deposition power 308 that when set as described below result in a Ge film 310 having a low H content and low roughness. The exemplary methods described include forming a Ge film using a PECVD process at a deposition temperature of about 400° C. to 550° C. The deposition pressure is about 5 to 8 Torr (666.612 Pa to 1066.579 Pa). The deposition power is about 50 W to 200 W. The deposition chemistry may include a combination of gaseous/liquid source of Ge such as $GeH_4$, hydrogen, helium, and nitrogen. The stoichiometry of the combination may be varied.

Figure 2:
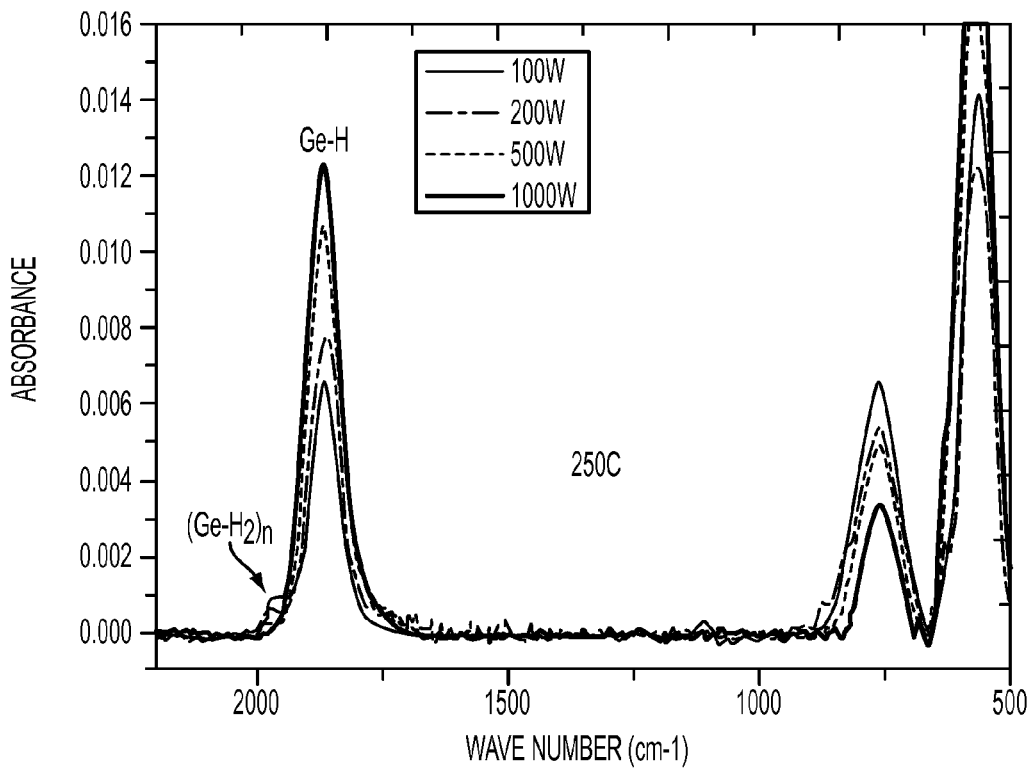
FIG. 2 illustrates a graph that includes a plot of absorbance versus wave number of a Ge film.
Figure 3:
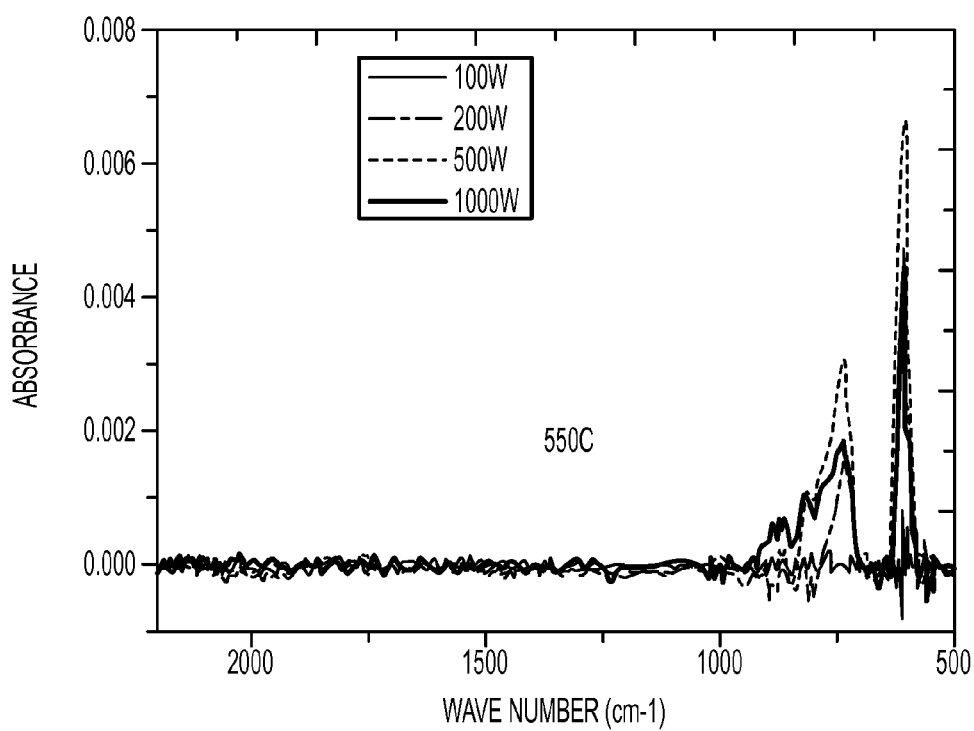
FIG. 3 illustrates a graph that similarly includes a plot of absorbance versus wave number of a Ge film.

FIG. 2 illustrates a graph that includes a plot of absorbance versus wave number at a variety of deposition powers (about 100 W, 200 W, 500 W, and 1000 W) of a Ge film that has been deposited in an exemplary PECVD process method at a deposition temperature of about 250° C. The graph indicates an undesirably high presence of hydrides Ge-H and $(Ge-H_2)_n$ in the deposited film. The graph also indicates the reduction of $(Ge-H_2)_n$ as the deposition power is increased such that the presence of $(Ge-H_2)_n$ is lessened at the deposition powers of about 500 W and 1000 W. FIG. 3 illustrates a graph that similarly includes a plot of absorbance versus wave number of a Ge film that has been deposited in an exemplary PECVD process method at a deposition temperature of about 550° C. and a variety of deposition powers (about 100 W, 200 W, 500 W, and 1000 W). FIG. 3 demonstrates that the PECVD process performed at a deposition temperature of between about 500° C.-550° C. considerably reduces the presence of Ge-H and $(Ge-H_2)_n$ in the deposited film as compared to the process performed at about 250° C. (as shown in FIG. 2).

FIG. 4 illustrates a table illustrating the resultant surface resistance (Rs) of a Ge film deposited using an exemplary PECVD deposition process at a deposition temperature of about 550° C. The table of FIG. 4 shows that the Rs of the Ge film increases as the deposition power increases. The presence of hydrides in the film increases the Rs of the film, thus the lower Rs may indicate that the Ge film deposited with a lower deposition power (e.g., about 100 W) includes considerably less hydrides than the Ge films deposited at higher deposition powers.

Figure 5:
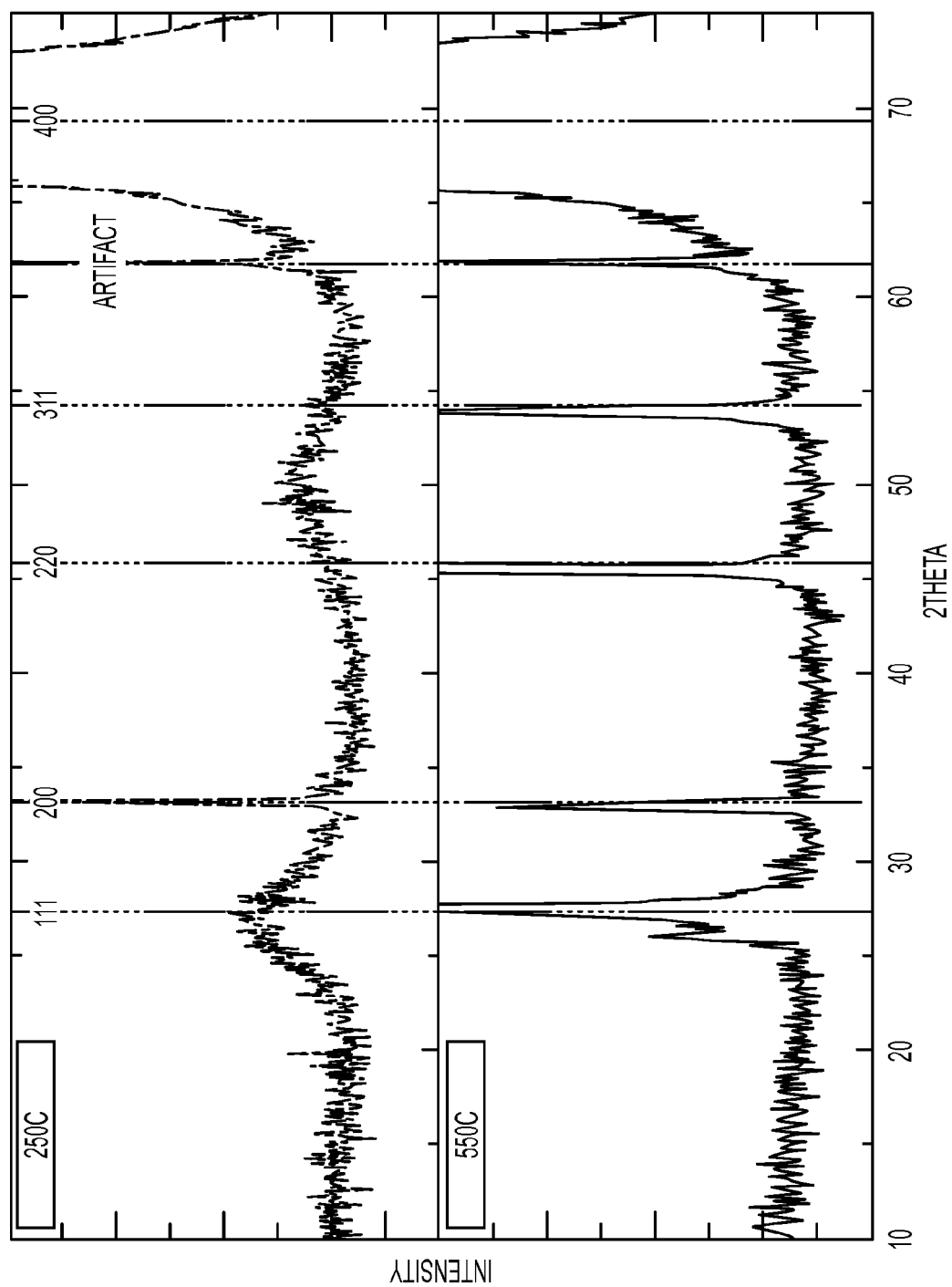
FIG. 5 illustrates graphs of the x-ray diffraction pattern over a range of diffraction angles for a Ge film.

FIG. 5 illustrates graphs of the intensity of x-ray diffraction over a range of angles of incidence (2 Theta) of a PECVD Ge film formed at about 250° C. and about 550° C. The crystalline orientation in Miller Index notation is indicated on the upper horizontal axis. FIG. 5 demonstrates that the Ge film formed at about 550° C. has a finer grain size than a similar Ge film formed at about 250° C.

FIG. 6 illustrates a table illustrating the resultant Rs of two exemplary Ge films formed with the inclusion of helium (He) that dilutes the $GeH_4$ precursor in the deposition chemistry. In the illustrated embodiment, the ratio of He to $GeH_4$ is about four to one. In alternate embodiments, other types of precursors may be used such as, for example, methylgermanes, ethylgermanes, tetrahalide germanes with Cl, F, Br, I, or digermanes. The Ge films were formed in two PECVD processes, the first pass at 400° C. and the second pass at 550° C., where one film was formed at a pressure of about 4 Torr (666.612 Pa) and the other film was formed at a pressure of about 8 Torr (1066.579 Pa). Previous experiments have shown that higher deposition temperatures and higher deposition power result in less H incorporation in the formed Ge film, but higher surface roughness. The table indicates that the inclusion of He at low temperatures (about 400° C.-550° C.) and low power (about 50 W) results in a desirably low Rs. The Ge films formed using the parameters of FIG. 6 and analyzed using an atomic force microscope (AFM) exhibit desirably low surface roughness of 1.6 nm (Rms=root mean square) at about 400° C. and Rms 2.5 nm at about 550° C.

Figure 7A:
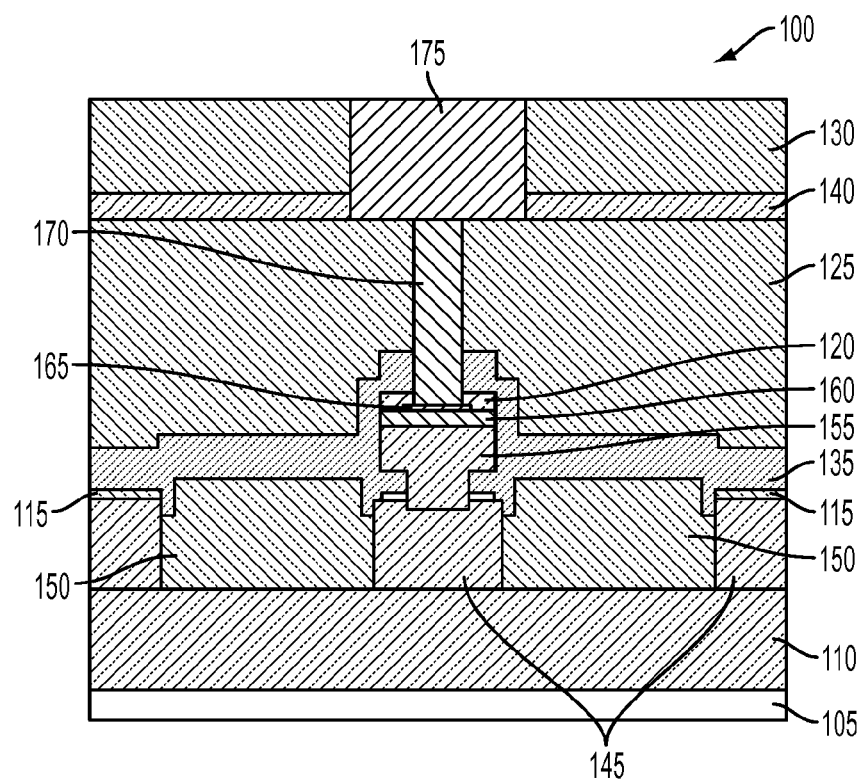
FIG. 7A shows a sectional view of an optoelectronic device.
Figure 7B:
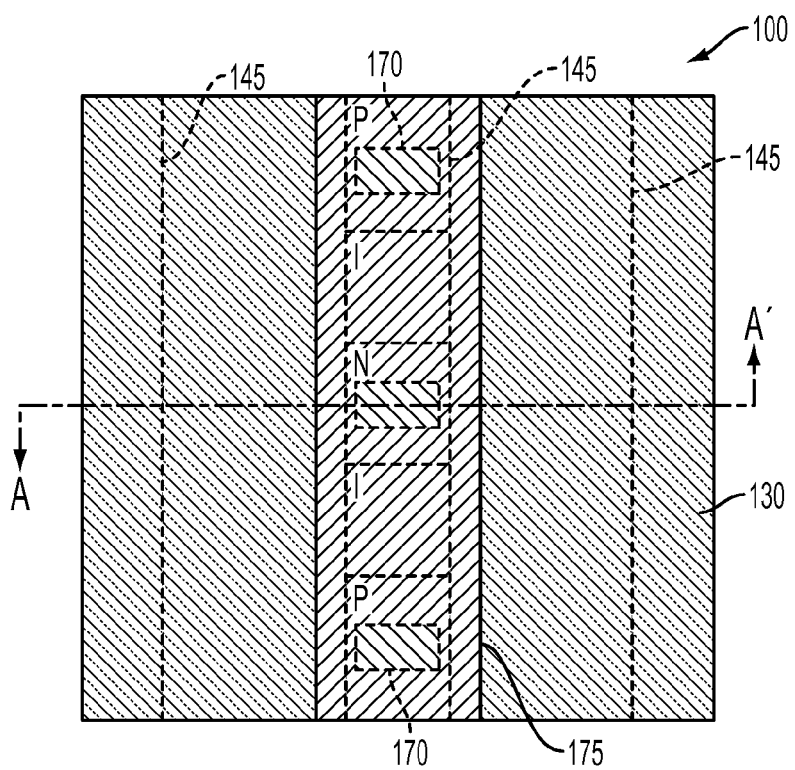
FIG. 7B shows a plan view of the optoelectronic device of FIG. 7A.

FIGS. 7A and 7B show a sectional view and a plan view, respectively, of an opto electronic device 100 in accordance with an exemplary illustrative embodiment. The optoelectronic device 100 is built onto a substrate 105. It includes a lower oxide layer 110, waveguide oxide layers 115, a photodetector oxide layer 120, a middle oxide layer 125, and an upper oxide layer 130. It further includes a lower nitride layer 135 and an upper nitride layer 140. Waveguide features 145 lie on the lower oxide layer, and oxide isolation features 150 fill in the regions between waveguide features. A photodetector feature 155 is disposed on the center waveguide feature and is capped by a photodetector capping layer 160 and an interfacial layer 165. Vertical contacts 170 land on the interfacial layer and are coupled to a metallization line 175.

In the particular illustrative optoelectronic device 100, the substrate 105 and the waveguide feature 145 comprise crystalline Si. Moreover, those elements labeled with the term "oxide" comprise silicon oxide ($SiO_x$) (hereinafter called "SiO"), while those elements labeled with the term "nitride" comprise silicon nitride ($Si_xN_y$) (hereinafter called "SiN"). The photodetector feature 155 includes Ge that may be formed using the PECVD process described above, while the photodetector capping layer 160 comprises doped (i.e., conductive) Si and the interfacial layer 165 comprises an alloy of nickel (Ni) and Si (hereinafter called "NiSi"). Finally, the vertical contacts 170 comprise tungsten (W) and also possibly a very thin liner comprising titanium (Ti) and titanium nitride (TiN), while the metallization line 175 comprises copper (Cu). Nevertheless, it should be noted that several of these material choices are merely illustrative and that substitute materials may be used in several instances with the resultant optoelectronic device still coming within the scope of the invention.

As indicated in the plan view in FIG. 1B, the photodetector feature 155 is contacted by several vertical contacts 170. These vertical contacts allow the photodetector feature to be differentially doped such that several p-i-n junctions (where "i" represents an intrinsic layer) are formed along its length. Alternatively, p-n junctions may be formed. The p-regions may, for example, comprise Ge doped with boron (B), while the n-regions may comprise Ge doped with phosphorous (P).

The illustrative optoelectronic device 100 is designed to operate as a waveguide photodetector. As a substitute for the transmission of electrical signals in metallization lines, light signals (e.g., light pulses) are guided by the waveguide features 145, which are shaped as strips. These strips may, for example, have widths in the range of about 200 nanometers (nm) to about 600 nm, and thicknesses in the range of about 150 nm to about 350 nm. If the waveguides are formed of Si, these dimensions allow the waveguide features to transmit single modes of light for wavelengths in the range of about 1.3 microns (μm) to about 1.55 μm. As the light pulses propagate in the center waveguide feature, they are resonantly coupled or guided into the overlying Ge photodetector feature 155, which also acts to propagate the light pulses to some extent. In the photodetector feature, the light pulses are converted into electrical signals by the creation of photocarriers in the photodetector feature's p-n junctions. These electrical signals, in turn, are transmitted away from the photodetector feature by the vertical contacts 170.

Figure 8:
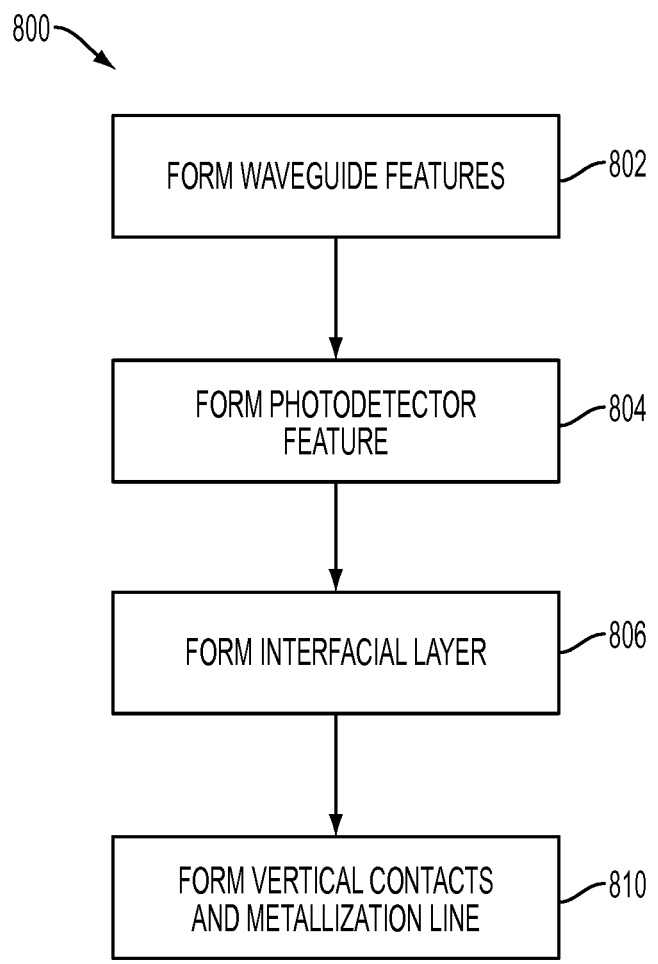
FIG. 8 shows a flow chart of an illustrative method for forming the optoelectronic device of FIG. 7.

FIG. 8 shows a flow chart of an illustrative method 800 for forming the optoelectronic device 100 (of FIG. 7). The block 802 in the method 800 comprises forming the waveguide features 145 using any appropriate processes. The block 804 in the method 800 comprises forming the photodetector feature 155. To accomplish this step, a hole is formed in the lower portion of the lower nitride layer 135 and in the waveguide oxide layer 115 overlying the center waveguide feature 145 using conventional photolithography and RIE. A layer of Ge that will eventually form the photodetector feature 155 is then deposited onto the film stack using a PECVD method similar to the methods described above. The block 806 in the method 800 comprises forming the interfacial layer 165. The block 810 in the method 800 comprises forming the vertical contacts 170 and metallization line 175.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A method for forming a photodetector device, the method comprising:
   forming a waveguide feature on a substrate; and
   forming a photodetector feature including a germanium (Ge) film, the Ge film deposited on the waveguide feature using a plasma enhanced chemical vapor deposition (PECVD) process that reduces an incorporation of H in the germanium film and reduces a surface roughness of the germanium film, the PECVD process having a deposition temperature from 500° C. to 550° C., and a deposition power from 50 W to 200 W, wherein the PECVD process includes $GeH_4$ precursor diluted with He, wherein a ratio of the He to $GeH_4$ is about four parts He to one part $GeH_4$.

2. The method of claim 1, wherein the method further comprises:
   forming an interfacial layer on the photodetector feature; and
   forming vertical contacts and a metallization line.

3. The method of claim 1, wherein the PECVD process has a deposition pressure from 666.612 Pa to 1066.579 Pa.

4. The method of claim 1, wherein deposition temperature from 500° C. to 550° C. reduces a presence of Ge-H and $(Ge-H_2)_n$ in the Ge film.

5. The method of claim 1, wherein the waveguide feature includes crystalline silicon.

6. The method of claim 2, wherein the vertical contacts include a conductive material.

7. A method for forming a germanium film, the method comprising depositing a germanium film on a substrate using a plasma enhanced chemical vapor deposition (PECVD) process that reduces an incorporation of H in the germanium film and reduces a surface roughness of the germanium film, the PECVD process having a deposition temperature from 500° C. to 550° C., and a deposition power from 50 W to 200 W, wherein the PECVD process includes $GeH_4$ precursor diluted with He, wherein a ratio of the He to $GeH_4$ is about four parts He to one part $GeH_4$.

8. The method of claim 7, wherein the PECVD process has a deposition pressure from 666.612 Pa to 1066.579 Pa.

9. The method of claim 7, wherein the deposition temperature from 500° C. to 550° C. reduces a presence of Ge-H and $(Ge-H_2)_n$ in the Ge film.

* * * * *